United States Patent [19]

Gupta et al.

[11] Patent Number: 4,546,454
[45] Date of Patent: Oct. 8, 1985

[54] NON-VOLATILE MEMORY CELL FUSE ELEMENT

[75] Inventors: Anil Gupta, Sunnyvale; George Perlegos, Fremont, both of Calif.

[73] Assignee: Seeq Technology, Inc., San Jose, Calif.

[21] Appl. No.: 439,602

[22] Filed: Nov. 5, 1982

[51] Int. Cl.[4] .............................................. G11C 11/40
[52] U.S. Cl. ...................................... 365/200; 371/10
[58] Field of Search ................... 365/200, 210; 371/10, 371/11

[56] References Cited

U.S. PATENT DOCUMENTS 3,753,244  8/1973  Sumilas et al. ..................... 364/200

Primary Examiner—Joseph A. Popek
Attorney, Agent, or Firm—Lyon & Lyon

[57] ABSTRACT

A non-volatile memory cell circuit is used to replace a polysilicon fuse as an enabling element for a redundant row or column of memory cells in a semiconductor memory array. The fuse is divided into read and program sections, allowing a large device to be used for reading and a small device to be used for programming, thus permitting programming of all fuses in a redundant row simultaneously with minimal current consumption. The circuit may be embodied as a five-device or a four-device configuration.

13 Claims, 7 Drawing Figures

NON-VOLATILE MEMORY CELL FUSE ELEMENT

BACKGROUND OF THE INVENTION

1. Field of the Invention

This invention pertains to semiconductor memory arrays arranged in matrices of rows and columns of memory cells. More particularly, it pertains to the manner in which a row or column containing one or more defective memory cells may be removed from the circuit and a row or column of extra substitute cells fabricated in the array during the manufacturing process can be electrically connected to replace them.

2. The Prior Art

Semiconductor memory arrays are widely used in virtually all facets of electronics technology. Like other integrated circuit devices they are subject to problems caused by defects introduced during the manufacturing process which often render the entire chip containing the defect useless. Recently, however, to provide for situations in which the defects occur in the memory array itself rather than in the peripheral circuitry, manufacturers have began to equip the arrays with spare rows or columns which may be selectively substituted for a row or column in which a defect has rendered one or more memory cells inoperable. The ability to substitute spare rows or columns for inoperable ones has dramatically increased the yield of good circuits, thus increasing the cost-effectiveness of the manufacturing operations.

Typically, the substitution of good redundant rows or columns of memory cells for defective rows or columns is implemented during testing of completed wafers when individual die which have bad cells at one or more address locations are identified. The row or column containing the defective cell or cells is permanently disabled by electrically removing it from the array, and the redundant row or column is conditioned to respond to the address location or locations formerly occupied by the afflicted row or column.

Early redundancy schemes stored the addresses of faulty locations in a memory, such as a ROM, and used the contents of the memory located at the address of the faulty memory cell to enable another substitute cell and disable the faulty location. An example of such a scheme is disclosed in U.S. Pat. No. 3,753,244 to Sumilas. This scheme, however, has proved to be unsatisfactory for today's fast access time requirements, since the extra time consumed by the substitution mechanism is intolerable for some system applications.

Currently, on-chip substitution of good cells for faulty cells in memory arrays is implemented by electrically or physically disconnecting faulty rows or columns of cells from the array, and electrically connecting substitute rows or columns to the row or column address decoding circuitry on the chip in such a manner that each responds to the address bit pattern which formerly selected the faulty row or column. Redundancy is implemented either before or after packaging of the memory chip and has been accomplished by use of one of two mechanisms: vaporization of polysilicon fuses by use of pulses of electrical current, and vaporization of conductor material with accurately focused laser beams.

These methods have proven to be generally satisfactory for the purpose of implementing row or column redundancy in memory arrays. Some of the characteristics inherent in the implementation of such redundancy schemes have, however, presented various drawbacks which must presently be accepted if redundancy is to be used.

Polysilicon fuse redundancy implementation brings with it the need to supply apertures in the vapox glass passivation layer of the memory array, thus presenting the potential for mobile-ion contamination of the on-chip circuitry. In addition, currents on the order of 10-20 milliamperes are necessary to ensure clean and complete vaporization of the polysilicon material comprising each fuse. Thus, the on-chip devices used to supply the fuse-blowing current to the polysilicon fuses must necessarily be large enough to handle current loads of this magnitude. In addition, the presence of vaporized fuse material on the chip surface has been associated with problems, as has the opening in the vapox passivation layer, through which contamination of the chip may occur. Furthermore, since implementation of a single row or column may necessitate the blowing of a number of such polysilicon fuses in memory arrays of larger sizes, practical considerations because of fuse-blowing current requirements have made it necessary to blow only a single fuse at a time. This creates extra human or machine labor time which must be spent in the final manufacturing stages of producing such memory arrays where redundancy is to be utilized.

Laser redundancy implementation, while eliminating the need to employ additional on-chip real estate in the form of circuitry having the current-carrying capacity to blow polysilicon fuses, replaces that need with a requirement for highly specialized and accurate laser equipment. Such equipment is expensive, requires skilled personnel to use and maintain and usually is capable of vaporizing only one target at a time. Moreover, as memory arrays become more dense and line widths grow smaller, beam positioning requirements will necessarily become more critical.

OBJECTS OF THE INVENTION

Accordingly, it is an object of the present invention to provide a means for implementing redundancy which overcomes the shortcomings of these prior art schemes.

It is a further object of this invention to provide a means for implementing redundancy which does not entail the vaporization of a fuse material.

It is another object of this invention to provide a means for implementing redundancy which does not require apertures through the passivating glass layer of a semiconductor memory array.

It is another object of the present invention to provide a means for implementing redundancy which allows all redundancy-enabling procedures to be accomplished at the same time for replacement of a single defective row or column.

It is yet another object of the invention to provide a means for implementing redundancy which avoids the presence of debris from vaporized fuse elements on the surface of the chip.

BRIEF DESCRIPTION OF THE DRAWINGS

These and other objects of the invention may be understood with reference to the accompanying description and drawings, in which.

DETAILED DESCRIPTION OF THE INVENTION

Because the present invention replaces the widely used polysilicon fuse, an understanding of the configuration and operation of the polysilicon fuse will facilitate an understanding of the invention disclosed herein.

Figure 1:
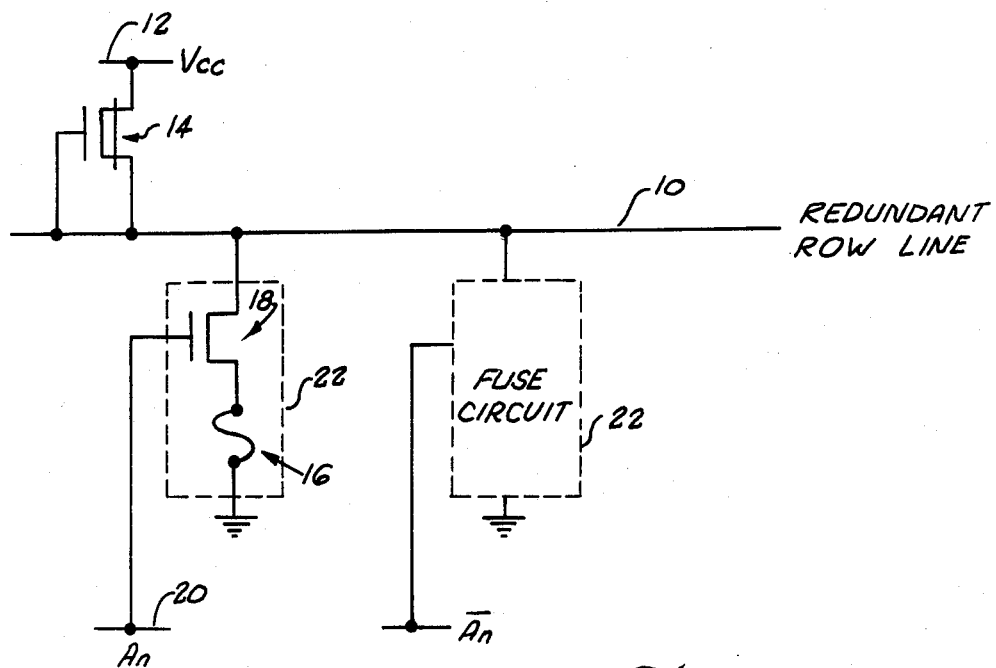
FIG. 1 shows a typical polysilicon prior-art fuse arrangement of the type presently employed in memory arrays possessing a redundancy feature.

Referring first to FIG. 1, an extra or redundant, row line to which extra memory cells are connected is depicted at 10, connected to a current source at a voltage $V_{cc}$, shown at numeral 12, via depletion pullup device 14 as is known in the art. A polysilicon fuse 16 connects word line 10 to ground through enhancement device 18. The gate of enhancement device 18 is driven by the signal appearing on X-address line $A_n$, indicated at numeral 20. The entire fuse circuit, which the present inventory replaces, is shown within dashed lines 22. Those skilled in the art will realize that, in a typical memory array, the total number of address lines will depend on the size of the memory array and that the row or X-address lines are arranged in pairs, i.e. $A_n$ and its complement $\overline{A_n}$.

In order to provide for the maximum flexibility in substituting any redundant row for any regular array row containing one or more defective momory cells, those skilled in the art will appreciate that the number of fuses 16 and their associated devices 18, together comprising fuse circuits 22, necessary in any redundant row will be equal to the total number of X-address lines $A_n$ and $\overline{A_n}$. In this manner, any redundant row may be configured to recognize the X-address bit pattern of any array row and thus any redundant row may be substituted for any defective array row.

If a memory array containing redundant rows is a good part, i.e., one in which there are no defective memory cells, all of the fuses 16 are left intact. Thus, when any address-enabling bit pattern appears on X-address lines $A_n$ and $\overline{A_n}$, turning on one or more devices 18, redundant row line 10 is pulled to ground through one or more polysilicon fuse elements 16 and is thus disabled.

When a defective cell effectively destroys a row in the memory array, however, it can be replaced with a spare or redundant row by blowing the appropriate fuses associated with X-address lines $A_n$ and $\overline{A_n}$ such that when the proper combinations of X address-enabling signals acts to turn on devices 18 connected to those address lines, redundant row line 10 will not be pulled to ground, but rather will be charged up to supply voltage $V_{cc}$, at numeral 12, through depletion pull-up device 14, since the ground path for redundant row line 10 through device 18 does not exist where fuses have been blown corresponding to the bit pattern for that row address.

The normal method of blowing such fuses has been to raise redundant row line 10 to a high voltage, such as 20 volts, while presenting the same high voltage to selected ones of X-address lines $A_n$ and $\overline{A_n}$, thus, turning on the gates of selected ones of devices 18. Current flowing through polysilicon fuse element 16, usually on the order of magnitude of 10–20 mA, is sufficient to cause vaporization of selected ones of fuse elements 16, thus programming the redundant row.

Once a redundant row line 10 has been programmed to respond to a given row address, circuitry on the memory chip senses when it has been selected, i.e., the action of pull-up device 14 causes the voltage on redundant row line 10 to rise to $V_{cc}$. Such circuitry acts to disable all non-redundant rows in the array, including the row containing the defect which has been replaced by the redundant row. This prevents errors caused by row contention. This may be easily accomplished by providing each non-redundant row in the array with an extra pull-down device activated by the circuitry which senses the rise in voltage of redundant row line 10, thus indicating selection of a redundant row. This pull-down device in each row acts to ground the row line when a redundant row has been selected.

Figure 2:
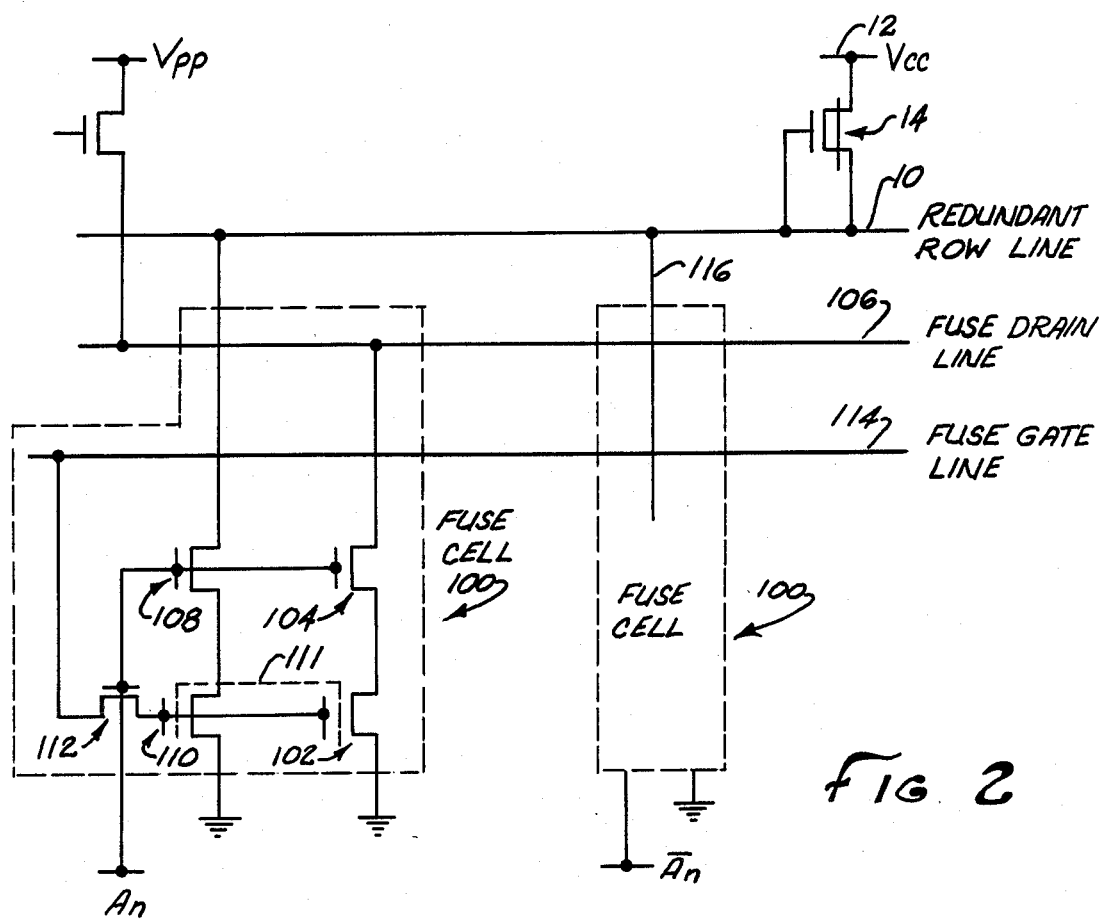
FIG. 2 shows an embodiment of the present invention utilizing EPROM type cells as redundancy fuse elements.

Referring now to FIG. 2, an embodiment of the present invention is depicted wherein a unique circuit containing five MOS transistors has been substituted for each polysilicon fuse circuit 22 of FIG. 1.

The circuitry disposed within dashed area 100 of FIG. 2 replaces polysilicon fuse 16 and selection device 18, and, for purposes of this specification, will be referred to as a fuse cell. Fuse cell 100 is comprised of three single gate MOS transistors and two floating polysilicon gate MOS transistors which share a common floating gate 111. Fuse program device 102 is an MOS transistor of the floating gate type known in the art for use as an EPROM memory device, see, e.g. U.S. Pat. No. 3,996,657 to Simko, et al., and U.S. Pat. No. 3,984,822 to Simko et al. Fuse program device 102 is a small device having its source connected to ground and its drain connected to the source of program select device 104, which is an enhancement mode MOS transistor. The drain of program select device 104 is connected to fuse drain line 106. There is one fuse drain line 106 provided per redundant row 10 in a memory array using the present invention.

The control gate of program select device 104 is connected to the control gate of read select device 108. Read select device 108 has its drain connected to word line 10 and is analogous to fuse select device 18 of FIG. 1. The source of read select device 108 is connected to the drain of a second floating gate EPROM-type MOS transistor, fuse read device 110, whose floating gate is fabricated to be common with the floating gate of fuse program device 102. Like fuse program device 102, fuse read device 110 has its source grounded. The control gates of devices 102 and 110 are commonly connected to the source of a depletion mode MOS transistor, transfer device 112. The drain of transfer device 112 is connected to fuse gate line 114. There is one fuse gate line 114 per redundant row in a memory array using the present invention. The control gate of transfer device 112 is, along with the control gates of read and program select devices 108 and 104, connected to X-address line $A_n$. As is the case when polysilicon fuses are used, those skilled in the art will recognize that for every pair of X-address lines $A_n$ and $\overline{A_n}$, there are two fuse cells 100, one associated with $A_n$ and one associated with $\overline{A_n}$. For illustration, another fuse cell 100 is shown in phantom as a dashed line in FIG. 2 connected to redundant word line 10 via line 116 and associated with address line $\overline{A_n}$.

Further, those skilled in the art will appreciate that for a redundant row line 10 to be capable of replacing any row in the memory array with which it is used, it must have 2n fuse cells, where n = the number of X-address lines.

The operation of fuse cell 100 is best understood again with reference to FIG. 2. The functional organization of the fuse cell is such that it is divided into program and read sections, devices 102 and 104 comprising the programming section, devices 108 and 110 comprising the read section. Depletion transfer device 112 is a select device common to both the read and programming sections.

Prior to programming the fuse cell by placing a charge on the floating gate 111 common to devices 102 and 110, fuse read device 110 will conduct when a control voltage of proper magnitude, usually $V_{cc}$, the supply voltage, is placed on its control gate via transfer device 112. Fuse read device 110 is a relatively large device, roughly ten times the size of depletion pull-up device 14, and so, when a signal at address line $A_n$ causes read select device 108 to turn on, a current path exists between Vcc at numeral 12, through pullup device 14, read select device 108, fuse read device 110 and ground. As will be readily appreciated by those skilled in the art, the ratios of the sizes of devices 14, 108 and 110 are such that when all are turned on, and when floating gate 111 does not have charge on it, redundant word line 10, connected to the node between the source of pullup device 14 and read select device 108, will have a logic low level potential of close to zero volts on it. In this respect, devices 108 and 110 act like device 18 and polysilicon fuse 16 of FIG. 1, when polysilicon fuse 16 is in its unblown state, to keep redundant word line 10 at approximately ground potential.

By placing a charge on floating gate 111, the user of the fuse cell of the present invention performs an operation equivalent to blowing the polysilicon fuse 16 of FIG. 1. Since floating gate 111 is common to both devices 110 and 102, after it is programmed by placing charge on it by way of programming fuse program device 102, it effectively places both device 102 and 110 in a programmed state.

In order to program the floating gate 111, both the fuse drain line 106 and the fuse gate line 114 are brought to a voltage of approximately 20 volts, hereinafter referred to as $V_{pp}$, while the address line $A_n$ or $\overline{A_n}$, to which the gates of devices 104, 108 and 112 are connected, is also brought to $V_{pp}$ thus turning on all of those devices.

This action causes electrons to be trapped in floating gate 111 thus programming it by placing a net negative charge on it, a process which takes on the order of 10 mSec. Fuse program device 102 is smaller in size than fuse read device 110 so that it will draw a smaller amount of current than will fuse read device 110 when it is in a conducting state. This allows all fuse cells in a redundant row to be programmed simultaneously using an external $V_{pp}$ supply, a procedure which is impossible where polysilicon fuses 16 are employed, since an unrealistically large device would be necessary to provide current to blow all fuses simultaneously, and because, in some larger arrays, potentially destructive currents would be caused to flow in the chip during programming.

Once floating gate 111 is charged in the above manner, all appropriate fuse cells 100 being simultaneously programmed, each fuse cell 100 behaves like the polysilicon fuse circuit 22 of FIG. 1. When the appropriate combinations of addresses are presented to address lines $A_n$ and $\overline{A_n}$ the fuse cell behaves in its read mode as follows.

After programming fuse cell 100, fuse drain line 106 is allowed to float. Fuse gate line 114 is held at $V_{cc}$. When a logic high signal on the address line to which the fuse cell is connected ($A_n$ or $\overline{A_n}$) turns on transfer device 112, the control gate of device 110 is enabled, as is the control gate of read select device 108. If floating gate 111 has a charge on it, the source drain channel of fuse read device 110 will not conduct and redundant row line 10 will not be pulled to ground. If the address bit pattern on all address lines $A_n$ and $\overline{A_n}$ corresponds to the programmed floating gates of fuse cells 100 connected to any given word line 10, that word line will not be pulled to ground but will be allowed to rise to a voltage level determined by the characteristics of pullup device 14 and will be thus enabled. This level will be sensed as a logic high level, and through known circuit means, such as an extra pulldown device on all non-redundant rows, will be used to disable all non-redundant rows to prevent contention between the redundant row and the damaged row which it is replacing.

A second embodiment of the present invention may be realized using an EEPROM device for programming the redundant rows in place of an EPROM device such as device 102. EEPROM devices are generally similar to EPROM devices except that a portion of the floating gate is separated from the substrate of the device by a thin oxide or tunnel dielectric region which serves as the site for device programming. These devices are known in the art, see, e.g. U.S. Pat. No. 4,115,914 to Harari and U.S. Pat. No. 4,203,158 to Frohman-Benchkowski. Such an embodiment is illustrated in FIG. 3.

Figure 3:
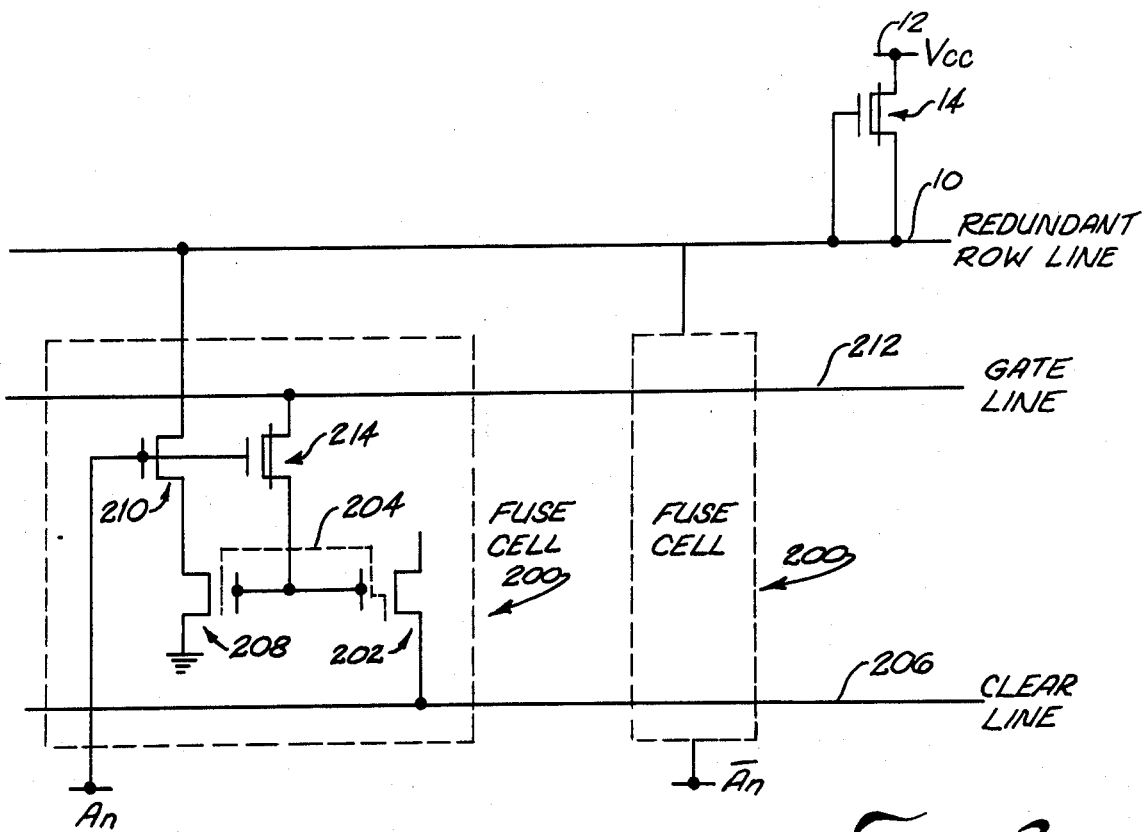
FIG. 3 shows an embodiment of the present invention utilizing EEPROM type cells as redundancy elements.

Referring now to FIG. 3 a fuse cell 200 is illustrated within dashed lines. Fuse cell 200 comprises an EEPROM fuse program device 202, having a floating polysilicon gate 204. The source of fuse program device 202 is connected to clear line 206, common to all fuse cells 200 in all redundant rows 10 within the memory array. Unlike the EPROM embodiment disclosed herein, the EEPROM embodiment uses no DC current to program and erase the floating gate 204. There is no need therefore, to employ a write select device such as device 104 or a fuse drain line 106 of FIG. 2 to provide drain voltage to the circuit of FIG. 3 for programming. The drain region of write memory device 202 can thus remain uncommitted or floating.

In other respects, this embodiment is similar to the EPROM embodiment. Comparison of FIG. 3 with FIG. 2 reveals that the read section of both embodiments may be identical. EPROM type fuse read device 208 shares floating gate 204 with the EPROM fuse program device 202. Fuse read device 208 is identical in structure to a floating gate EPROM device, except that it does not have the threshold-adjusting implant usually used in the channel of an EPROM device. The source of fuse read device 208 is grounded and its drain is connected to the source of read select device 210, which communicates the state of the fuse cell to redundant word line 10 when its control gate is enabled by a signal on address line $A_n$ to which it is directly connected.

One respect in which the EEPROM embodiment differs from the EPROM embodiment is in the programming of the fuse cell 200. Unlike an EPROM device, which must have both its gate and drain voltages raised to $V_{pp}$ to program its floating gate, it is known in the art that an EEPROM may have its floating gate programmed by raising either its drain voltage or its gate voltage to the programming voltage $V_{pp}$ while its source may be left floating. In the present invention, the programming voltage is supplied to all fuse cells 200 in a redundant row word line 10 along a gate line 212. In order to assure that only designated fuse cells 200 are programmed when a programming voltage is presented along gate line 212, transfer device 214, a depletion device, is interposed between the control gates of floating gate memory devices 202 and 208, and the gate line 212, the source of the programming voltage for the fuse cell 200. As with the EPROM embodiment of FIG. 2, programming time is on the order of 10 mSec.

The control gate of transfer device 214 is connected to address line $A_n$ (or $\overline{A_n}$) and will transfer the gate voltage from gate line 212 only when X- address line $A_n$ has selected its associated fuse cell 200 for programming.

Before any fuse cell 200 in a redundant row in a memory array constructed according to this invention may be programmed, all fuse cells 200 must be erased, because the EEPROM floating gates 204 are in an unpredictable state at the end of the manufacturing process. This procedure must therefore be performed whether or not redundancy is to be used, and is accomplished by clear line 206, common to all fuse cells 200 in the array. By placing gate line 212 at zero volts while raising clear line 206 to the programming voltage $V_{pp}$, all of the fuse program devices 202 and fuse read devices 208 are placed in the erased or cleared state. This process takes about 10 mSec. At this point programming of selected fuse cells 200 may begin if necessary.

In order to program a selected fuse cell 200, clear line 206 is set to zero volts, gate line 212 for the redundant word line 10 which is to be enabled is set to the programming voltage $V_{pp}$, and the X-address line $A_n$ (or $\overline{A_n}$) associated with the fuse cell 200 to be programmed is set to the programming voltage $V_{pp}$. Under these conditions, transfer device 214 is turned on, since its gate voltage and drain voltage are both raised to $V_{pp}$. For fuse cells 100 which are to remain unprogrammed $A_n$ (or $\overline{A_n}$) is held at approximately zero volts.

The programming voltage on the gate line 212 is thus transferred to the control gates of fuse read device 208 and EEPROM fuse program device 202 for fuse cells 100 selected for programming. The source of fuse program device 202, connected to clear line 206, is at zero volts, satisfying the condiitions necessary for programming it. Only fuse program devices 202 in fuse cells 200 having their X- address lines $A_n$ (or $\overline{A_n}$) at programming voltage $V_{pp}$ will be programmed, since any address line $A_n$ at zero volts will not turn on transfer device 214 in unselected ones of fuse cells 200 sufficiently to transfer to the control gate of fuse program device 202 a voltage high enough to cause electrons to tunnel to floating gate 204.

The conditions for reading fuse cell 200 are also slightly different from those for reading the condition of fuse cell 100 of FIG. 2. Clear line 206 is set to zero volts to assure that there is no inadvertent erasure of the programmed information by reverse tunnelling of electrons from floating gate 204 through the tunnel dielectric of fuse program device 202. Gate line 212 is biased to between approximately zero to two volts during the reading of the cell. There is no need for this voltage to be set at the nominal five-volt $V_{cc}$ level typical for these arrays since the voltage present on this line is enough to provide for turn on of fuse read device 208 with an adequate margin above its unprogrammed threshold voltage. If fuse read device 208 is programmed, the gate voltage of zero to two volts will not be adequate to turn it on. In addition, placing the voltage of gate line 212 at this low level of zero to two volts minimizes any read/-disturb problems known to affect EEPROM devices which utilize the Fowler-Nordheim tunnelling phenomenon for programming a floating gate.

During read, when X-address line $A_n$ (or $\overline{A_n}$) enables the control gate of read select device 210, redundant word line 10 is either pulled down to approximately ground potential by the ratio of the sizes of devices 210, 208 and pullup device 14, or charges up to $V_{cc}$ because the shifted threshold voltage of fuse read device 208 prevents that device from turning on, thus acting as the equivalent of an intact or blown polysilicon fuse, respectively.

The EEPROM embodiment described above is preferably utilized in certain situations, such as where the main memory array to which redundancy is added is itself an EEPROM array, since the fabrication of the EEPROM device as a part of the fuse cell does not encompass any additional processing steps because formation of the tunnel dielectric region of the EEPROM device 202 will occur simultaneously with the formation of the tunnel dielectric regions of the EEPROM cells in the main memory array. Since this embodiment utilizes no DC current to program the fuse cells 200, programming may be accomplished by the on-chip high voltage generator found on some of today's 5-volt-only EEPROM memory arrays. An additional advantage is that there is no need for the extra threshold adjusting channel implant in fuse read device 208, which would be required if the embodiment of FIG. 2 were used.

Those skilled in the art will recognize that neither this fuse cell nor the EPROM fuse cell may be used in memory arrays such as EPROMs which have an ultraviolet light erasable window since the application of ultraviolet light through the window will not only erase the information contained in the main memory array but will also erase the redundancy programming which has been implemented in the chip.

There are two alternate EPROM embodiments of the present invention, either of which is preferred over the EPROM embodiment depicted in and described with respect to FIG. 2. Either of these embodiments is preferrable since they utilize one less device per fuse cell than does the embodiment of FIG. 2.

Figure 4:
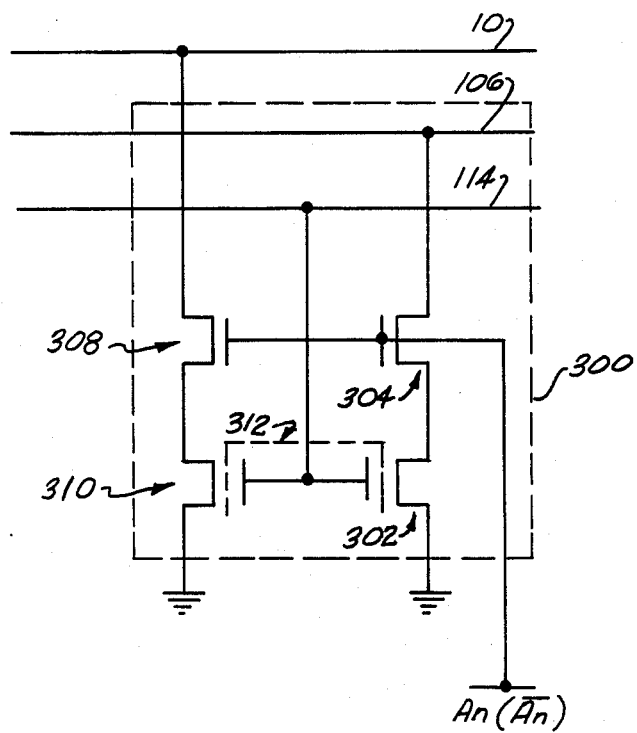
FIGS. 4 and 5 show alternate preferred embodiments of the EPROM cell redundancy fuse element of FIG. 2.

In the first preferred embodiment, in FIG. 4, a fuse cell in dashed lines 300 is shown connected to redundant word line 10, fuse drain line 106, and fuse gate line 114 as in the embodiment of FIG. 2. However, this embodiment eliminates the use of transfer device 112 and is seen to include fuse program device 302, program select device 304, read select device 308 and fuse read device 310. Devices 302 and 304 make up the programming section of the fuse cell 300 and devices 308 and 310 make up the read section of fuse cell 300. Fuse program device 302 and fuse read deviced 310 share a common floating gate 312. The operation of the embodiment of FIG. 4 is exactly the same as that described with respect to FIG. 2 except that the function and presence of the transfer device 112 are eliminated. Transfer device 112 can be eliminated since EPROM device 302 will not program unless both its control gate and drain have programming voltage impressed upon them. Since in this embodiment address line $A_n$ is connected directly to the control gates of program select device 304 and read select device 308, programming of EPROM fuse program device 302 will not occur unless programming voltage is applied to the control gate of program select device 304. Thus, although for any given redundant word line 10 which is selected for programming, fuse drain line 106 and fuse gate line 114 will be brought high, only fuse cells 300 whose program select devices 304 have had their gates enabled by a programming voltage $V_{pp}$ appearing on address line $A_n$ (or $\overline{A_n}$) will be programmed. The operation of memory cell 300 during read (normal operation of the memory array) is exactly the same as described with respect to the embodiment described in FIG. 2.

Figure 5:
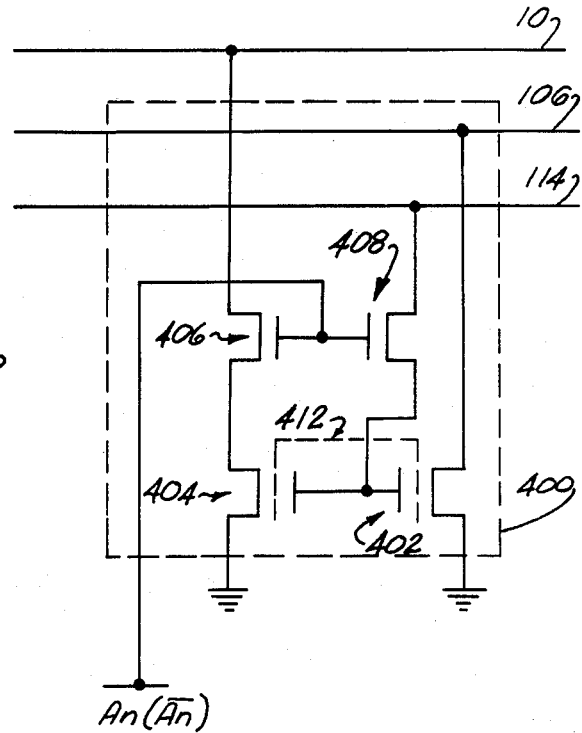

An alternate preferred embodiment utilizing an EPROM device in a fuse cell is shown in FIG. 5. In the embodiment of FIG. 5, EPROM fuse program device 402 comprises the programming section of fuse cell 400 and fuse read device 404 and read select device 406 comprise the read section of fuse cell 400. In this embodiment, transfer device 408 is included. As can be seen from FIG. 5, along any given redundant row line 10 which is selected for programming, although fuse drain line 106 and fuse gate line 114 will have the programming voltage $V_{pp}$ applied to them, EPROM memory write device 402 will only be programmed in fuse cells 400 which have been selected by having programming voltage $V_{pp}$ applied to address line $A_n$ (or $\overline{A_n}$). Only in such selected fuse cells 400 will transfer device 408 be enabled thus impressing the programming voltage from fuse gate line 114 to the control gate of EPROM fuse program device 402. Any fuse cells 400 which are not so selected will not have programming voltage $V_{pp}$ applied to the control gates of fuse program device 402 and so will not be programmed.

To illustrate the realization of the fuse cell circuits of the present invention utilizing currently available MOS technology, preferred geometric layouts of the fuse cells of the embodiments disclosed in connection with FIGS. 3 and 4 will be shown.

Figure 6:
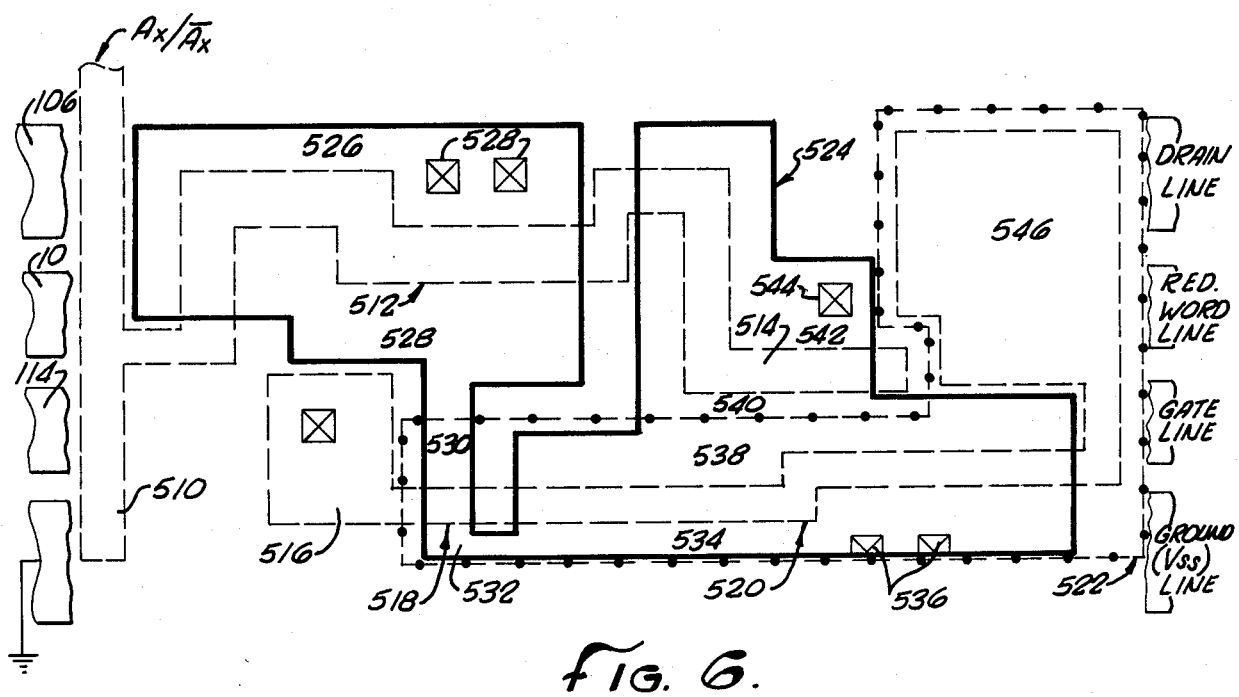
FIGS. 6 and 7 illustrate a preferred chip layout for the embodiments of the present invertion of FIGS. 4 and 3 respectively utilizing N channel MOS technology.

First, a layout of the fuse cell circuit depicted in FIG. 4 is shown in FIG. 6 utilizing double polysilicon gate technology.

A first continuous segment 510 of the second polysilicon layer forms X-address line $A_n$ (or $\overline{A_n}$), the control gate 512 of program select device 304 and the control gate 514 of read select device 308. A second continuous segment 516 of the second polysilicon layer forms the control gate 518 of fuse program device 302 and the control gate 520 of fuse read device 310.

Floating gate 522, formed from the first polysilicon layer, is common to fuse program device 302 and fuse read device 310.

The N+ diffusion region 524 contains the source and drain areas of devices 302, 304, 308 and 310. The drain of program select device 304 is formed in the portion of N+ diffusion area 524 in FIG. 6 above control gate 512, shown generally at numeral 526. Contacts 528 connect drain area 526 of program select device 304 to drain line 106. Multiple contacts are used to assure sufficient current-carrying capacity through the contacts for the programming current needed to program fuse program device 302, although those skilled in the art will recognize that a single larger contact will suffice.

The area in FIG. 6 below control gate 512 in N+ diffusion area 524 forms the source of program select device 304, shown at 528, which is contiguous with drain area 530 of fuse program device 304. The drain area 530 of fuse program device 304 is located in the portion of diffusion area 524 above control gate 518, and the source 532 of that device is located in the area portion of diffusion 524 below control gate 518.

As can be seen from FIG. 6, the source region 534 of fuse read device 310 is common with source region 532 of fuse program device 302. Contacts 536 connect both source 532 and source 534 to ground, and are shown as half-contacts to indicate that two fuse cells can be formed as mirror images of one another as is shown in the art.

The portion of N+ diffusion area 524 in FIG. 6 above control gate 520 of fuse read device 310 forms the drain region 538 of that device. Drain region 538 of fuse read device 310 is contiguous with the source region 540 of read select device 308. Both are located between segments 510 and 516 of the second polysilicon layer. The drain 542 of read select device 308 is located in the area in FIG. 6 above control gate 514. Contact 544 connects drain 542 of read select device 308 to redundant word line 10.

The portion 546 of second polysilicon layer 516 first polysilicon layer 522, comprising the floating gate of devices 302 and 310 is located in an area over which there is field oxide instead of N+ diffusion. This region is used to increase the capacitive coupling between the floating gate and control gate of the dual gate devices in order to facilitate programming.

Figure 7:
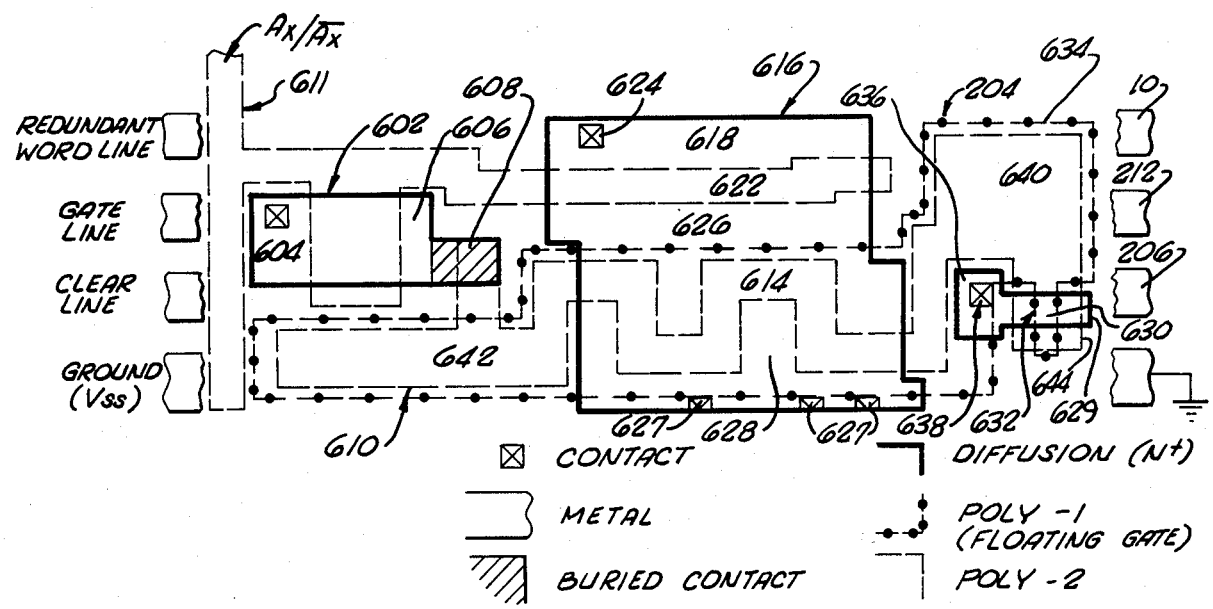

Referring now to FIG. 7, a geometric layout of the fuse cell embodiment disclosed with respect to FIG. 3 is depicted.

N+ diffusion region 602 contains drain area 604 and source area 606 of transfer device 214. The portion 608 of source area 606 is a buried contact through which connection is made between the source of device 214 and a segment 610 of the second polysilicon layer. Segment 610 of the second polysilicon layer forms the control gates of devices 202 and 208. A second segment 611 of the second polysilicon layer forms the control gates of devices 210 and 214, as well as X-address line $A_n$ (or $\overline{A_n}$). The portion of segment 611 overlying N+ diffusion region 602 forms the control gate of transfer device 214.

N+ diffusion region 616 contains the source and drain regions of both devices 208 and 210. Drain region 618 of read select device 210 is located in FIG. 6 above the portion 622 of segment 611 of the second polysilicon layer. The portion 622 of segment 611 of the second polysilicon layer overlying N+ diffusion region 616 forms the control gate of read select device 210. Contact 624 connects the drain region 618 of device 210 to redundant row line 10. Area 626 in N+ diffusion region 616, located between segment 611 and segment 610 of the second polysilicon layer, comprises both the source region of read select device 210 and the drain region of fuse read device 208. The portion 628 of N+ diffusion region 616 located in FIG. 7 below segment 610 of the second polysilicon layer 610 comprises the source of fuse read device 208. The portion 614 of second polysilicon layer segment 610 overlying N+ diffusion region 616 forms the control gate of fuse read device 208. Contacts 627 connect the source region 628 of fuse read device 208 to ground. As in FIG. 6, contacts 627 are shown as half contacts to indicate that another fuse cell may be conveniently layed out as a mirror image of FIG. 7 on the chip.

N+ diffusion region 629 forms the tunnel device 202. The portion 630 of N+ diffusion region 628 underlying tongue-shaped portion 632 of the first polysilicon layer or floating gate 634 is where the thin tunnel dielectric is located. It is at this site that tunneling of electrons takes place to program the fuse cell 200. Area 636 in N+ diffusion region 629 is the drain area of the tunnel device 202, and contact 638 located therein connects the drain of tunnel device 202 to clear line 206.

In areas 640 and 642, segment 610 of the second polysilicon layer and first polysilicon layer 634 lie over field oxide rather than diffusion regions. This increases capacitive coupling between floating gate 634 and the control gate 644 of the tunnel device to facilitate programming.

Although the present invention has been described in embodiments comprising row redundancy, those of ordinary skill in the art will recognize that it is equally applicable to memory arrays utilizing column redundancy, the only changes being necessary are ones obviously necessary to implement column rather than row redundancy.

All of the semiconductor devices disclosed herein may be fabricated using process technology known to those skilled in the art, using known physical layout geometry for the semiconductor structures described herein. Accordingly the scope of the present invention is limited only by the following claims.

What is claimed is:

1. A semiconductor circuit for enabling a redundant word line in a semiconductor memory array, said circuit including:
   non-volatile memory means capable of assuming a first unprogrammed state and a second programmed state;
   addressing means responsive to addressing signals and coupled to said non-volatile memory means for selecting said non-volatile memory means for programming;
   programming means adapted to receive programming signals for selectively causing said non-volatile memory means to change from said first to said second state in response to said programming and addressing signals;
   semiconductor switching means connected between said redundant word line and said non-volatile memory means and responsive to said addressing signals for determining whether said non-volatile memory means is in said first or said second state and further for disabling said redundant word line in response to said first state and for enabling said redundant word line in response to said second state.

2. The circuit of claim 1 wherein said non-volatile memory means comprises two floating gate MOS transistors sharing a common floating gate.

3. The circuit of claim 2 wherein the first of said MOS floating gate transistors responds to said programming and addressing signals to change said non-volatile memory means from said first to said second state and wherein the second of said MOS floating gate transistors indicates whether said non-volatile memory means is in said first or said second state.

4. The circuit of claim 3 wherein the first one of said two floating gate MOS transistors is an EEPROM device having a thin tunnel dielectric portion between its said floating gate and its substrate and the second one of said two floating gate MOS transistors is an EPROM type device.

5. The circuit of Claim 4 wherein said semiconductor switching means, said addressing means and said programming means comprise MOS transistors.

6. The circuit of claims 3, 4 and 5 wherein said first one of said floating gate MOS transistors is 4 microns by 3 microns in size and said second one of said MOS floating gate transistors is 50 microns by 3 microns in size.

7. The circuit of claim 5 wherein said semiconductor switching means comprises an MOS transistor switch connected between said second one of said MOS floating gate transistors and said redundant word line, and said programming means comprises an MOS transistor switch connected between the first one of said MOS floating gate transistors and a source of said programming signals.

8. The circuit of claim 3 wherein said floating gate MOS transistors are EEPROM devices.

9. The circuit of claim 8 wherein said semiconductor switching means and said programming means comprise MOS transistors.

10. The circuit of claim 9 wherein said semiconductor switching means comprises first MOS transistor switch connected between said second one of said MOS floating gate transistors and said redundant word line, and said programming means includes a second MOS transistor switch connected between the first one of said MOS floating gate transistors and a source of said programming signals.

11. The circuit of claim 10 further including a third MOS transistor connected to the gates of said semiconductor switching means and said programming means and a source of programming signals, the gate of said third MOS transistor connected to a source of said addressing signals.

12. The circuit of claim 9 wherein said semiconductor switching means comprises a first MOS transistor switch connected between the second one of said floating gate MOS transistors and said redundant word line and said programming means comprises a second MOS transistor switch connected between the control gates of said MOS floating gate transistors and a source of programming signals, said second MOS transistor switch driven by a source of addressing signals.

13. A semiconductor circuit for enabling a redundant word line in a semiconductor memory array, said circuit including:
   non-volatile memory means capable of assuming a first unprogrammed state and a second programmed state;
   programming means coupled to said non-volatile memory means and adapted to receive programming signals for selectively causing said non-volatile memory means to change from said first to said second state in response to said programming signals, said programming means including addressing means responsive to addressing signals for selecting said non-volatile memory means;
   semiconductor switching means connected between said redundant word line and said non-volatile memory means and responsive to said addressing signals for determining whether said non-volatile memory means is in said first or said second state and further for disabling said redundant word line in response to said first state and for enabling said redundant word line in response to said second state.

* * * * *